US012444576B2

(12) United States Patent
Choi et al.

(10) Patent No.: US 12,444,576 B2
(45) Date of Patent: Oct. 14, 2025

(54) APPARATUS AND METHOD FOR TREATING SUBSTRATE

(71) Applicant: SEMES CO., LTD., Chungcheongnam-do (KR)

(72) Inventors: Jin Woo Choi, Gyeonggi-do (KR); Seung Jun Oh, Gyeonggi-do (KR); Jin Woo Nam, Chungcheongbuk-do (KR); Jang Hee Lee, Gyeonggi-do (KR); Young Hak Park, Chungcheongnam-do (KR); Ahn Na Seo, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 536 days.

(21) Appl. No.: 17/564,280

(22) Filed: Dec. 29, 2021

(65) Prior Publication Data

US 2022/0208515 A1 Jun. 30, 2022

(30) Foreign Application Priority Data

Dec. 30, 2020 (KR) ........................ 10-2020-0188108

(51) Int. Cl.
*H01J 37/32* (2006.01)

(52) U.S. Cl.
CPC .... *H01J 37/3244* (2013.01); *H01J 37/32834* (2013.01)

(58) Field of Classification Search
None
See application file for complete search history.

(56) References Cited

U.S. PATENT DOCUMENTS 7,323,080 B2 * 1/2008 Kim .................. H01L 21/67051 156/345.39
10,475,626 B2 * 11/2019 Collins ............... H01J 37/3233
(Continued)

FOREIGN PATENT DOCUMENTS

CN 103426818 A 12/2013
CN 108630513 A 10/2018
(Continued)

OTHER PUBLICATIONS

"Understanding Vacuum and Vacuum Measurement" found at https://solarmfg.com/wp-content/uploads/2016/02/Understanding-Vacuum-9.pdf written by Rea'l J. Fradette et al published 2016 (Year: 2016).*
(Continued)

*Primary Examiner* — Sylvia Macarthur
(74) *Attorney, Agent, or Firm* — Carter, DeLuca & Farrell LLP

(57) ABSTRACT

A substrate treating apparatus includes a process chamber having a reaction space with one or more insulation members exposed to the reaction space; a substrate support member supporting a substrate at the reaction space; a gas supply member selectively supplying a passivation gas and a process gas to the reaction space; a plasma source exciting a gas into a plasma; and a controller which controls the gas supply member and the plasma source, and after a substrate to be treated is taken into the reaction space and supported by the support member, the controller controls the gas supply member and the plasma source to supply the passivation gas and the process gas to the reaction space simultaneously or sequentially, and generate a plasma in the reaction space under the condition of stopping a supply of the passivation gas but supplying the process gas.

16 Claims, 9 Drawing Sheets

(56) References Cited

U.S. PATENT DOCUMENTS

| | | | | |
|---|---|---|---|---|
| 2002/0007790 | A1* | 1/2002 | Park | C23C 16/45565 134/37 |
| 2002/0111000 | A1* | 8/2002 | Kawakami | H01L 21/02255 438/584 |
| 2006/0046355 | A1 | 3/2006 | Parekh | |
| 2006/0068104 | A1* | 3/2006 | Ishizaka | C23C 16/45529 257/E21.171 |
| 2006/0137607 | A1* | 6/2006 | Seo | H01J 37/3244 257/E21.295 |
| 2007/0234961 | A1* | 10/2007 | Takahashi | C23C 16/345 118/725 |
| 2017/0162369 | A1* | 6/2017 | Kang | H01J 37/32862 |
| 2019/0326115 | A1 | 10/2019 | Zheng et al. | |
| 2022/0208515 | A1* | 6/2022 | Choi | H01J 37/32449 |

FOREIGN PATENT DOCUMENTS

| | | | | |
|---|---|---|---|---|
| KR | 10-2017-0066081 | A | | 6/2017 |
| TW | 473913 | B | * | 1/2002 |
| TW | 494502 | B | * | 7/2002 |
| TW | I254989 | B | * | 5/2006 |
| TW | I672742 | B | * | 9/2019 |

OTHER PUBLICATIONS

Office Action dated Apr. 16, 2023 issued by the Korean Patent Office in corresponding Korean Patent Application No. 10-2020-0188108, with English translation.

Chinese Office Action issued by the China National Intellectual Property Administration on Mar. 31, 2025 in corresponding CN Patent Application No. 202111647647.X, with English translation.

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2020-0188108 filed on Dec. 30, 2020, in the Korean Intellectual Property Office, the entire contents of which are hereby incorporated by reference.

BACKGROUND

Embodiments of the inventive concept described herein relate to a substrate treating apparatus and a substrate treating method.

As semiconductor devices became highly integrated, a size of an active region also decreased. As a result, a channel length of an MOS transistor formed in the active region has also decreased. When the channel length of the MOS transistor decreases, an operation performance of the transistor decreases due to a short channel effect. Accordingly, various studies have been conducted to maximize the performance of a device while reducing the size of the devices formed on the substrate.

Among them, a representative example is a fin-FET device having a fin structure. Such a fin-FET device may be formed by etching a substrate such as a wafer including a silicon (Si). In this case, a roughness of a substrate surface generated during an etching process may cause a deterioration in performance of the transistor. Accordingly, in general, a damage and the roughness of the substrate surface are improved through an annealing treatment that applying radicals to the substrate surface. As a method for healing such damage, an annealing method using a hydrogen plasma has been proposed. This method is known to heal such damage by injecting a hydrogen into the process chamber and forming a plasma, making silicon atoms on the surface of the channel movable by radical hydrogen. However, in order to actually apply this to plasma treating apparatuses, several problems such as particle generation need to be solved.

SUMMARY

Embodiments of the inventive concept provide a substrate treating apparatus and a substrate treating method for treating a substrate efficiently.

Embodiments of the inventive concept provide a substrate treating apparatus and a substrate treating method capable of effectively performing a surface treatment on a substrate.

Embodiments of the inventive concept provide a substrate treating apparatus and a substrate treating method capable of protecting insulation components provided in an apparatus and reducing particle contamination of a substrate.

Embodiments of the inventive concept provide a substrate treating apparatus and a substrate treating method capable of increasing a production volume per unit time by protecting insulation components provided in an apparatus, reducing particle contamination of a substrate, and reducing an entire process time.

Embodiments of the inventive concept provide a substrate treating apparatus and a substrate treating method capable of effectively removing impurities remaining on a substrate.

Embodiments of the inventive concept provide a substrate treating apparatus and a substrate treating method capable of effectively improving a substrate surface damage and a substrate surface roughness.

The effects of the inventive concept are not limited to the above-described effects, and effects not mentioned may be clearly understood by those skilled in the art from the present specification and the accompanying drawings.

An embodiment of the inventive concept provides a substrate treating apparatus. The substrate treating apparatus comprises a process chamber having a reaction space with one or more insulation member exposed to the reaction space; a substrate support member supporting a substrate at the reaction space; a gas supply member selectively supplying a passivation gas and a process gas to the reaction space; a plasma source exciting a gas into a plasma; and a controller, wherein the controller controls the gas supply member and the plasma source, and after a substrate to be treated is taken into the reaction space and supported by the support member, the controller controls the gas supply member and the plasma source to perform: a first step of supplying the passivation gas and the process gas to the reaction space simultaneously or sequentially; and a second step of generating a plasma in the reaction space under the condition of stopping a supply of the passivation gas but supplying the process gas.

In an embodiment, impurities including a germanium adheres to the substrate to be treated, and the substrate comprises Si substrate.

In an embodiment, the insulation member comprises a quartz, an Al2O3, an AlN, a Y2O3 or combinations thereof.

In an embodiment, the passivation gas includes a nitrogen-based gas.

In an embodiment, the process gas includes a hydrogen.

In an embodiment, the plasma excited from the passivation gas includes nitrogen radicals.

In an embodiment, the plasma excited from the process gas includes hydrogen radicals.

In an embodiment, at least one exhaust hole are formed at the process chamber and connected to an exhaust line exhausting the reaction space, and the controller controls a decompression member connected to the exhaust line so that a pressure of the reaction space reaches 50 mTorr to 1 Torr, and the passivation gas is controlled to be supplied at 10 sccm to 1000 sccm for 10 seconds to 60 seconds.

In an embodiment, the controller controls the gas supply member so as to supply the process gas at 10 sccm to 1000 sccm and supply the passivation gas.

In an embodiment, the controller controls the substrate support member so that a temperature of the substrate is adjusted to a first temperature during the second step, and then the temperature of the substrate is adjusted to a second temperature which is different from the first temperature.

An embodiment of the inventive concept provides a substrate treating method for treating a surface of a substrate having impurities including a germanium adhering thereon. The substrate treating apparatus comprises, after a substrate to be treated is taken into a reaction space with at least one insulation member being exposed thereto: a first step of supplying a passivation gas and a process gas to the reaction space simultaneously or sequentially; and a second step of generating a plasma in the reaction space under the condition of stopping a supply of the passivation gas but supplying the plasma source.

In an embodiment, the substrate to be treated comprises a silicon (Si) substrate.

In an embodiment, the insulation member comprises a quartz, an Al203, an AlN, a Y203 or combinations thereof.

In an embodiment, the passivation gas includes a nitrogen-based gas.

In an embodiment, the process gas includes a hydrogen.

In an embodiment, the plasma excited from the passivation gas includes nitrogen radicals.

In an embodiment, the plasma excited from the passivation gas includes hydrogen radicals.

In an embodiment, in an atmosphere controlled so a pressure of the reaction space becomes 50 mTorr to 1 Torr, and the passivation gas is supplied at 10 sccm to 1000 sccm for 10 seconds to 60 seconds.

In an embodiment, the process gas is supplied at 10 sccm to 1000 sccm, as well as a supplying of the passivation gas.

An embodiment of the inventive concept provides a substrate treating apparatus. The substrate treating apparatus comprises a process chamber having a reaction space with at least one insulation member being exposed to the reaction space, the at least one insulation member comprising a quartz, an A1203, an A1N, a Y203, or combinations thereof; a substrate support member supporting the substrate at the reaction space; a gas supply member selectively supplying a passivation gas including a nitrogen-based gas and a process gas including a hydrogen to the reaction space; a plasma source exciting the gas to a plasma; and a controller, wherein the controller controls the gas supply member and the plasma source, and the controllers, after a substrate to be treated is taken into the reaction space and supported by the support member, the substrate to be treated comprising a silicon (Si) substrate and having impurities including a germanium adhering to thereon, controls the gas supply member and the plasma source to perform: a first step of supplying the passivation gas and the process gas to the reaction space simultaneously or sequentially; and a second step of generating a plasma in the reaction space under the condition of stopping a supply of the passivation gas but supplying the process gas.

According to an embodiment of the inventive concept, the substrate may be efficiently treated.

According to an embodiment of the inventive concept, a surface treatment on a substrate may be effectively performed.

According to an embodiment of the inventive concept, it is possible to protect insulation components provided in the device and reduce particle contamination of a substrate.

According to an embodiment of the inventive concept, production volume per unit time may be increased by protecting insulation components provided in the device and reducing particle contamination of a substrate while shortening the entire process time.

According to an embodiment of the inventive concept, impurities remaining on the substrate may be effectively removed.

According to an embodiment of the inventive concept, a surface damage and a surface roughness may be effectively improved.

The effects of this invention are not limited to the above-described effects, and it should be understood that it includes all effects that can be inferred from the detailed description of this invention or the configuration of the invention described in the claims.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
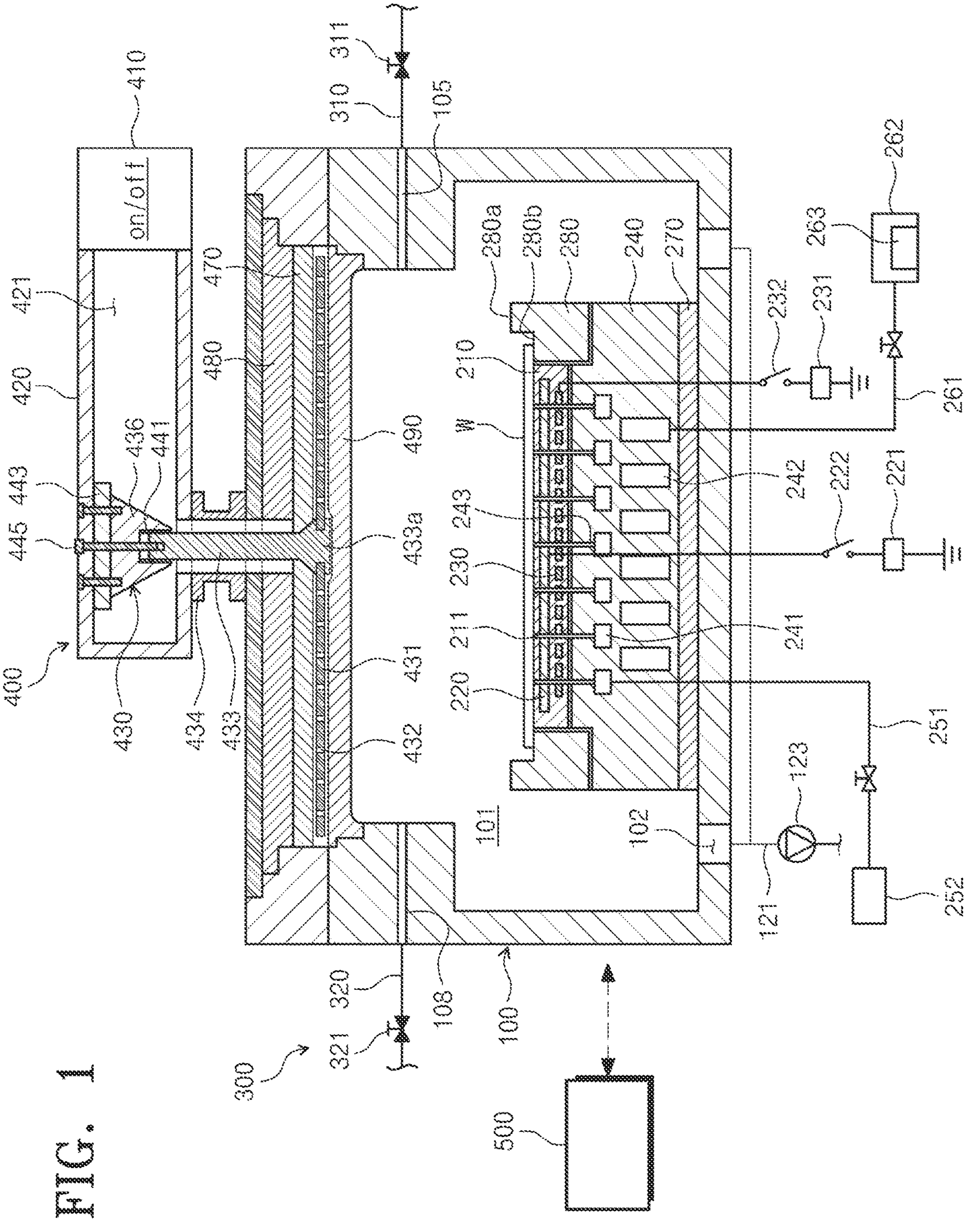
FIG. 1 is a view illustrating a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, an embodiment of the inventive concept will be described in detail with reference to FIG. 1 to FIG. 9.

FIG. 1 is a view illustrating a substrate treating apparatus according to an embodiment of the inventive concept.

Referring to FIG. 1, the substrate treating apparatus performs a plasma processing on the substrate W. The substrate treating apparatus includes a process chamber 100, a substrate support member 200, a gas supply member 300, a microwave application unit 400, and a controller 500.

The process chamber 100 may have a reaction space 101. The reaction space 101 may be a space in which the substrate W is treated. An opening (not shown) may be formed on a sidewall of the process chamber 100. The opening is provided as a passage through which the substrate W may enter and exit the process chamber 100. The opening is opened and closed by a door (not shown). An exhaust hole 102 is formed on a bottom surface of the process chamber 100. The exhaust hole 102 is connected to an exhaust line 121. The exhaust line 121 may be connected to a decompression member 123. The decompression member 123 may be a pump. A reaction by-product generated during the process and a gas remaining inside the process chamber 100 may be discharged to an outside through the exhaust line 121.

In addition, a pressure of the reaction space 101 may be maintained at a set pressure by a decompression provided by the decompression member 123 through the exhaust line 121. The pressure of the reaction space 101 may be maintained at a pressure close to a vacuum. That is, the process chamber 100 may be a vacuum chamber in which the pressure of the reaction space 101 is maintained at a pressure close to the vacuum during treating of the substrate W. For example, the controller 500 to be described later may control the decompression member 123 such that the pressure of the reaction space 101 becomes a pressure between 10 mTorr and 4 Ton (e.g., 10 mTorr or more, and 4 Torr or less).

The substrate support member 200 is located inside the process chamber 100. The substrate support member 200 supports the substrate W. The substrate support member 200 may include an electrostatic chuck ESC that sucks the substrate W using an electrostatic force.

It is described that the substrate support member 200 according to an embodiment includes the electrostatic chuck ESC. The substrate support member 200 includes a dielectric plate 210, a bottom electrode 220, a heater 230, a support plate 240, an insulating plate 270, and a focus ring 280.

The dielectric plate 210 is located at a top end of the substrate support member 200. The dielectric plate 210 is provided as a disk-shaped dielectric substance. The substrate W is disposed on a top surface of the dielectric plate 210. The top surface of the dielectric plate 210 has a radius smaller than that of the substrate W. Therefore, an edge region of the substrate W is located outside the dielectric plate 210. A first supply fluid channel 211 is formed at the dielectric plate 210. The first supply fluid channel 211 is provided from the top surface to the bottom surface of the dielectric plate 210. A plurality of first supply fluid channels 211 are formed to be spaced apart from each other, and are provided as a passage through which a heat transfer medium is supplied to the bottom surface of the substrate W.

The bottom electrode 220 and the heater 230 are buried within the dielectric plate 210. The bottom electrode 220 is located above the heater 230. The bottom electrode 220 is electrically connected to a bottom power source 221. The bottom power source 221 includes a DC power. A bottom power switch 222 is installed between the bottom electrode 220 and the bottom power source 221. The bottom electrode 220 may be electrically connected to the bottom power source 221 by an on/off of the bottom power switch 222. When the bottom power switch 222 is turned on, a DC current is applied to the bottom electrode 220. An electric force acts between the bottom electrode 220 and the substrate W by the current applied to the bottom electrode 220, and the substrate W is sucked to the dielectric plate 210 by the electric force.

The heater 230 may be a temperature control member that adjusts a temperature of the substrate W to a set temperature. In addition, the substrate W is maintained at the set temperature by a heat generated by the heater 230. The heater 230 includes a coil having a spiral shape. The heater 230 may be buried in the dielectric plate 210 at uniform intervals. The heater 230 may be heated by receiving a power from the heater power source 231. In addition, a heater power switch 232 may be installed between the heater 230 and the heater power source 231. The heater 230 may be electrically connected to the heater power source 231 by turning on/off the heater power switch 232. In addition, the temperature of the heater 230 may vary depending on a magnitude of power applied by the heater power source 231 to the heater 230. For example, the temperature of the heater 230 may also increase in proportion to the magnitude of power applied to the heater 230. In addition, the heater 230 may be connected to a heater sensor (not shown) that senses the temperature of the heater 230. The heater sensor may sense the temperature of the heater 230 in real time and transmit a detected real-time temperature of the heater 230 to the controller 500 to be described later. The controller 500 may vary the magnitude of power transmitted to the heater 230 based on the temperature of the heater 230 sensed by the heater sensor.

The support plate 240 is located below the dielectric plate 210. The bottom surface of the dielectric plate 210 and a top surface of the support plate 240 may be adhered by an adhesive 236. The support plate 240 may be provided in an aluminum material. The top surface of the support plate 240 may be stepped such that a central region is located higher than an edge region. The central region of the top surface of the support plate 240 has an area corresponding to the bottom surface of the dielectric plate 210 and is adhered to the bottom surface of the dielectric plate 210. A first circulation fluid channel 241, a second circulation fluid channel 242, and a second supply fluid channel 243 are formed at the support plate 240.

The first circulation fluid channel 241 is provided as a passage through which the heat transfer medium circulates. The first circulation fluid channel 241 may be formed in a spiral shape inside the support plate 240. Alternatively, the first circulation fluid channel 241 may be disposed such that ring-shaped fluid channels having different radii have the same center. Each of the first circulation fluid channels 241 may communicate with each other. The first circulation fluid channels 241 are formed at the same height.

The second circulation fluid channel 242 is provided as a passage through which a cooling fluid circulates. The second circulation fluid channel 242 may be formed in a spiral shape within the support plate 240. Alternatively, the second circulation fluid channel 242 may be disposed such that ring-shaped fluid channels having different radii have the same center. Each of the second circulation fluid channels 242 may communicate with each other. The second circulation fluid channel 242 may have a cross-sectional area greater than that of the first circulation fluid channel 241. The second circulation fluid channels 242 are formed at the same height. The second circulation fluid channel 242 may be located below the first circulation fluid channel 241.

The second supply fluid channel 243 upwardly extends from the first circulation fluid channel 241 and is provided to the top surface of the support plate 240. The second supply fluid channel 243 is provided in a number corresponding to the first supply fluid channel 211, and connects the first circulation fluid channel 241 and the first supply fluid channel 211.

The first circulation fluid channel 241 is connected to a heat transfer medium storage unit 252 through a heat transfer medium supply line 251. The heat transfer medium is stored in the heat transfer medium storage unit 252. The heat transfer medium includes an inert gas. According to an embodiment, the heat transfer medium includes a helium (He) gas. The helium gas is supplied to the first circulation fluid channel 241 through the supply line 251, and is supplied to the bottom surface of the substrate W through the second supply fluid channel 243 and the first supply fluid channel 211 sequentially. The helium gas serves as a medium through which a heat transferred from the plasma to the substrate W is transferred to the substrate support member 200. The ion particles contained in the plasma are attracted to the electric force formed in the substrate support member 200 and move to the substrate support member 200, and collide with the substrate W to perform an etching process while moving. A heat is generated at the substrate W while the ion particles collide with the substrate W. The heat generated from the substrate W is transferred to the substrate support member 200 through the helium gas supplied to the space between the bottom surface of the substrate W and the top surface of the dielectric plate 210. Thereby, the substrate W may be maintained at a set temperature.

The second circulation fluid channel 242 is connected to a cooling fluid storage unit 262 through a cooling fluid supply line 261. The cooling fluid is stored in the cooling fluid storage unit 262. A cooler 263 may be provided within the cooling fluid storage unit 262. The cooler 263 cools the cooling fluid to a preset temperature. Alternatively, the cooler 263 may be installed on the cooling fluid supply line 261. The cooling fluid supplied to the second circulation fluid channel 242 through the cooling fluid supply line 261 circulates along the second circulation fluid channel 242 to cool the support plate 240. A cooling of the support plate 240 cools the dielectric plate 210 and the substrate W together to maintain the substrate W at a preset temperature.

The insulating plate 270 is provided below the support plate 240. The insulating plate 270 is provided in a size corresponding to that of the support plate 240. The insulating plate 270 is located between the support plate 240 and the bottom surface of the chamber 100. The insulating plate 270 is made of an insulating material, and electrically insulates the support plate 240 from the chamber 100.

The focus ring 280 is disposed in an edge region of the substrate support member 200. The focus ring 280 has a ring shape and is disposed along a circumference of the dielectric plate 210. A top surface of the focus ring 280 may be stepped such that an outer portion 280*a* is higher than an inner portion 280*b*. The inner portion 280*b* of the top surface of the focus ring 280 is located at a same height as the top surface of the dielectric plate 210. The inner portion 280*b* of the top surface of the focus ring 280 supports the edge region of the substrate W located outside the dielectric plate 210. The outer portion 280*a* of the focus ring 280 is provided to surround the edge region of the substrate W. The focus ring 280 expands an electric field forming region so that the substrate W is located at a center of the region in which the plasma is formed. Accordingly, the plasma is uniformly formed over the entire area of the substrate W, so that each area of the substrate W may be uniformly etched.

The gas supply member 300 supplies a gas to the reaction space 101 of the process chamber 100. The gas supply member 300 may supply the gas into the process chamber 100 through the first gas supply hole 105 and the second gas supply hole 108 formed in the sidewall of the process chamber 100. The gas supplied by the gas supply member 300 to the reaction space 101 includes a process gas and a passivation gas. The process gas may include at least one gas selected from a hydrogen, an inert gas, or combinations thereof. Examples of the inert gas may include a helium (He), a neon (Ne), an argon (Ar), a krypton (Kr), a xenon (Xe), a radon (Rn), and the like. The passivation gas may include at least one gas selected from a nitrogen-based gas, an inert gas or combinations thereof. For example, the nitrogen-based gas may include at least one gas selected from N2, an ammonia (NH3), a hydrazine (NH4), or combinations thereof. Examples of the inert gas may include a helium (He), a neon (Ne), an argon (Ar), a krypton (Kr), a xenon (Xe), a radon (Rn), and the like.

A first gas supply hole 105 is connected to the first gas supply line 310. The first gas supply line 310 is connected to a process gas supply source (not shown). An opening/closing member 311 is installed at the first gas supply line 310, and whether or not the process gas is supplied to the reaction space 101 may be controlled according to an opening/closing operation of the opening/closing member 311. The second gas supply hole 108 is connected to the second gas supply line 320. The second gas supply line 320 is connected to a passivation gas supply source (not shown). An opening/closing member 321 is installed at the second gas supply line 320, and whether or not the passivation gas is supplied to the reaction space 101 may be controlled according to an opening/closing operation of the opening/closing member 321.

The microwave application unit 400 is provided as an example of a plasma source that applies an energy to the reaction space 101 of the process chamber 100 to excite a gas in the reaction space 101 into a plasma. The microwave application unit 400 may generate the plasma by exciting a process gas and/or a passivation gas.

The plasma excited from the process gas may include hydrogen radicals. The hydrogen radicals may be applied to the substrate W to remove impurities attached to the substrate W or to improve a roughness with respect to the surface of the substrate W. The plasma excited from the passivation gas passivates the surfaces of insulation components. The insulation components may be, for example, a dome member 490 provided as a ceiling of the reaction space 101, a sidewall liner (not illustrated), an exhaust baffle (not illustrated), etc. At least one of these components may be made of, for example, a material such as a quartz, an Al2O3, an AlN, and a Y2O3.

The microwave application unit 400 includes a microwave power source 410, a waveguide 420, a microwave antenna 430, a dielectric plate 470, a cooling plate 480, and a dome member 490.

The microwave power source 410 generates microwaves. The waveguide 420 is connected to the microwave power source 410 and provides a passage through which a microwave generated from the microwave power source 410 are transferred.

The microwave antenna 430 is located inside a front end of the waveguide 420. The microwave antenna 430 applies the microwave transferred through the waveguide 420 to an inside of the process chamber 100. For example, the microwave antenna 430 may receive a power applied by the microwave power source 410 and apply the microwave to the reaction space 101. In an embodiment, the microwave may have a preset power at a frequency of 2.45 GHz. The power applied to the microwave power source 410 may range from about 1000 W to about 3500 W.

The microwave antenna 430 includes an antenna plate 431, an antenna rod 433, an external conductor 434, a microwave adapter 436, a connector 441, a cooling plate 443, and an antenna height adjuster 445.

The antenna plate 431 is provided as a thin disk, and a plurality of slot holes 432 are formed. The slot holes 432 provide a passage through which microwaves pass through the slot holes 432. The slot holes 432 may be provided in various shapes. The slot holes 432 may be provided in a shape such as 'x', '+', '−', or the like. The slot holes 432 may be arranged to define a plurality of ring shapes. The rings have a same center and have radii of different sizes.

The antenna rod 433 is provided as a cylindrical rod. The antenna rod 433 is disposed with its lengthwise direction in an up/down. The antenna rod 433 is located above the antenna plate 431, and a bottom end portion thereof is inserted and fixed to a center of the antenna plate 431. The antenna rod 433 propagates the microwave to the antenna plate 431.

The external conductor 434 is located below a front end of the waveguide 420. A space connected to an inner space of the waveguide 420 is formed within the outer conductor 434 in the up/down direction. A partial region of the antenna rod 433 is located within the external conductor 434.

The microwave adapter 436 is located within the front end portion of the waveguide 420.

The microwave adapter 436 has a cone shape in which a top end has a larger radius than a bottom end. An accommodation space with an open bottom surface is formed at the bottom end of the microwave adapter 436.

The connector 441 is located at the accommodation space. The connector 441 is provided in a ring shape. An outer face of the connector 441 has a radius corresponding to an inner face of the accommodation space. The outer face of the connector 441 is fixedly located by being in contact with the inner face of the accommodation space. The connector 441 may be formed of a conductive material. A top end of the antenna rod 433 is located within the accommodation space and is fitted into an inner region of the connector 441. The top end of the antenna rod 433 is press fitted into the connector 441, and is electrically connected to the microwave adapter 436 through the connector 441.

The cooling plate 443 is coupled to a top end of the microwave adapter 436. The cooling plate 443 may be provided as a plate having a larger radius than the top end portion of the microwave adapter 436. The cooling plate 443 may be made of a material having a better thermal conductivity than the microwave adapter 436. The cooling plate 443 may be made of a copper (Cu) or an aluminum (Al). The cooling plate 443 promotes a cooling of the microwave adapter 436, thereby preventing thermal deformation of the microwave adapter 436.

The antenna height adjustment unit 445 connects the microwave adapter 436 and the antenna rod 433. In addition, the antenna height adjustment unit 445 moves the antenna rod 433 so that a relative height of the antenna plate 431 with respect to the microwave adapter 436 is changed. The antenna height adjustments unit 445 includes a bolt. The bolt 445 is inserted into the microwave adapter 436 in the up/down direction from a top to a bottom of the microwave adapter 436, and a bottom end is located in the accommodation space. The bolt 445 is inserted into a central region of the microwave adapter 436. The bottom end of the bolt 445 is inserted into the top end of the antenna rod 433. A screw groove into which the bottom end of the bolt 445 is inserted and fastened is formed at a preset depth in a top end portion of the antenna rod 433. The antenna rod 433 is moved in the up/down direction according to a rotation of the bolt 445. For example, when the bolt 445 is rotated clockwise, the antenna rod 433 may rise, and when the bolt 445 is rotated counterclockwise, the antenna rod 433 may fall. The antenna plate 431 may be moved in the up/down direction together with a movement of the antenna rod 433.

The dielectric plate 470 is located above the antenna plate 431. The dielectric plate 470 is provided as a dielectric material such as an alumina and a quartz. The microwave propagated in the up/down direction from the microwave antenna 430 propagate\ in a radial direction of the dielectric plate 470. The microwave propagated to the dielectric plate 470 is compressed and resonated. The resonant microwave is transmitted to the slot holes 432 of the antenna plate 431.

The cooling plate 480 is provided above the dielectric plate 470. The cooling plate 480 cools the dielectric plate 470. The cooling plate 480 may be formed of an aluminum material. The cooling plate 480 may cool the dielectric plate 470 by flowing a cooling fluid through a cooling fluid channel (not shown) formed therein. Cooling methods include a water-cooling method and an air-cooling method.

The dome member 490 is provided below the antenna plate 431. The dome member 490 is provided as a dielectric material such as an alumina or a quartz. The microwave passing through the slot holes 432 of the antenna plate 431 are radiated into the process chamber 100 through the dome member 490. The process gas supplied into the process chamber 100 by the electric field of the emitted microwave is excited in a plasma state. A top surface of the dome member 490 may be spaced apart from a bottom surface of the antenna plate 431 by a preset interval.

The antenna height adjustment unit 445 may move the antenna rod 433 in the up/down direction so that the relative height of the antenna plate 431 with respect to the microwave adapter 436 is changed. The antenna height adjustment unit 445 may move the antenna rod 433 in the up/down direction to maintain the antenna plate 431 and the dome member 490 at appropriate intervals.

The controller 500 may control the substrate treating apparatus. The controller 500 may control at least one of the decompression member 123, the substrate support member 200, the gas supply member 300, and the microwave application unit 400 of the substrate treating apparatus to perform a substrate treating method described below. In addition, the controller 500 may be provided with: a process controller made of a microprocessor (computer) that controls the substrate treating apparatus, a keyboard in which an operator operates a command input operation or the like to manage the substrate treating apparatus, a user interface made of a display or another object that visualizes and displays the operation of the substrate treating apparatus, a control program for executing treatment in the substrate treating apparatus under a control of the process controller, a program for executing a treatment in each component according to various data and treating conditions, and a storage unit storing a treating recipe. In addition, the user interface and the storage unit may be connected to the process controller. The treating recipe may be stored in a storage medium of the storage unit, the storage medium may be a hard disk, a portable disk such as a CD-ROM, a DVD, or a semiconductor memory such as a flash memory.

The controller 500 may maintain the temperature of the substrate W at a set temperature by adjusting the magnitude of power transferred by the heater power source 231 to the heater 230. For example, the controller 500 may recognize the temperature of the heater 230 detected by the heater sensor in real time. In addition, parameters in which the temperature of the substrate W changes according to the temperature of the heater 230, which is an experimental data previously performed, may be input to the controller 500. The controller 500 may control a supply of the process gas and the passivation gas. The controller 500 may control the decompression member 123 to adjust the pressure of the reaction space 101.

Figure 2:
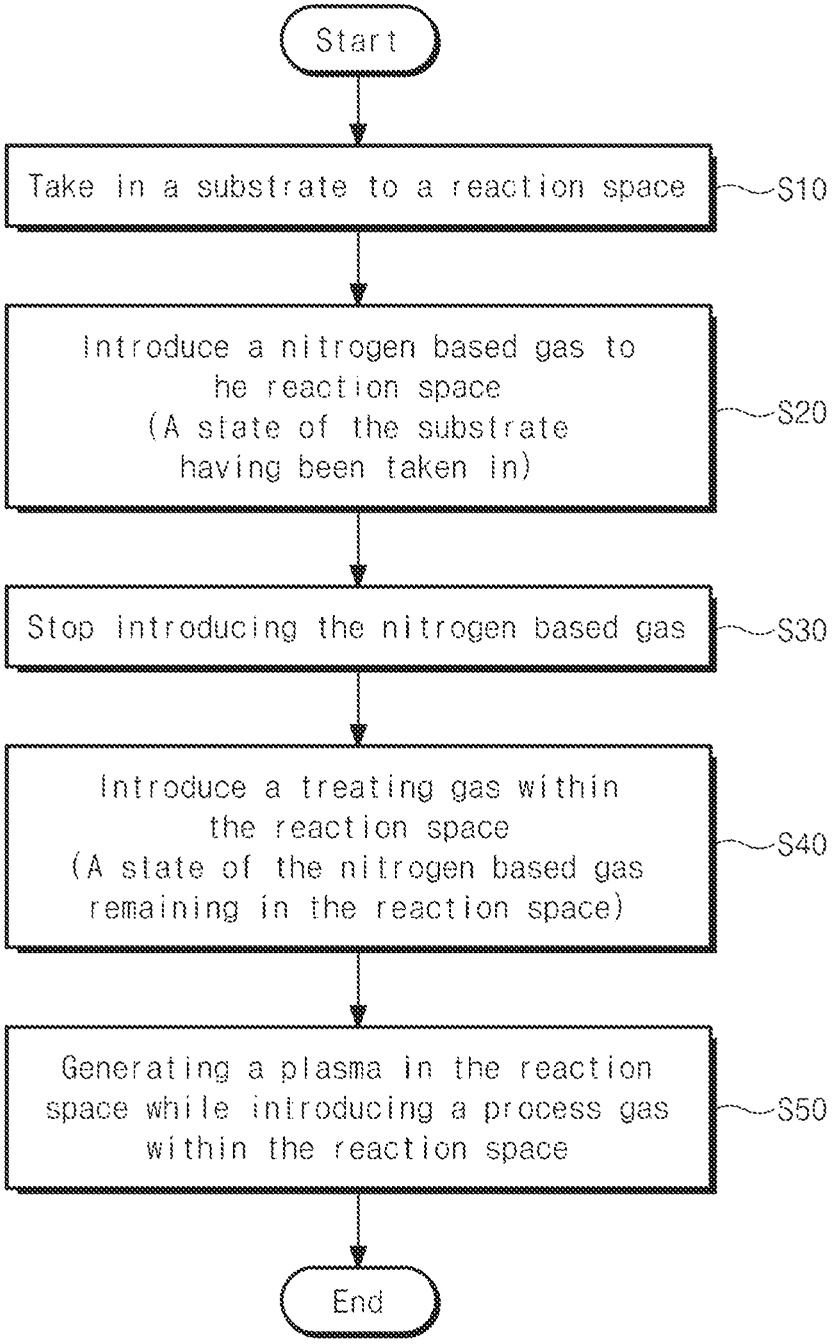
FIG. 2 is a flowchart illustrating a substrate treating method according to an embodiment of the inventive concept.

FIG. 2 is a flowchart illustrating a substrate treating method according to an embodiment of the inventive concept. Referring to FIG. 2, the substrate treating method according to an embodiment of the inventive concept sequentially performs steps S10, S20, S30, S40, and S50. According to another embodiment of the inventive concept, steps S10 and S20 may be sequentially performed, and steps S30, S40, and S50 may be simultaneously performed after step S20. Alternatively, according to another embodiment of the inventive concept, after step S10, step S20 and step S40 may be performed simultaneously or sequentially, and after step S30, step S50 may be performed. The substrate treating method according to an embodiment of the inventive concept simultaneously performs a passivation step and a plasma annealing step. Accordingly, it is possible to shorten a time required for passivation performed before the plasma annealing, thereby shortening the process progress time.

The substrate W, which is brought into the reaction space, may be made of a material including a silicon (Si).

According to the substrate treating method of an embodiment of the inventive concept, the substrate W is introduced into the reaction space 101 (step S10). As an example of the passivation gas, a nitrogen-based gas is supplied to the reaction space 101 within which a substrate has been disposed (step S20). The nitrogen-based gas may be supplied in a pressure atmosphere of 50 mTorr to 1 Torr at a flow rate of 10 sccm to 1000 sccm for 10 seconds to 60 seconds. When the nitrogen-based gas is sufficiently supplied to the reaction space 101, the supply of the nitrogen-based gas is stopped (step S30).

The process gas is supplied to the reaction space 101 within which the substrate W has been disposed (step S40). The process gas is, for example, a hydrogen gas, an inert gas or combinations thereof. The process gas is introduced in a state in which the nitrogen-based gas remains in the reaction space 101. The process gas is introduced into the reaction space 101, and the gas in the reaction space 101 is excited into the plasma while the nitrogen-based gas remains in the reaction space 101 (step S50). In an embodiment, the microwave power source 410 is controlled to be in an on state, and thus the process gas and the nitrogen-based gas in the reaction space 101 are excited into the plasma state.

According to steps S10 to S50, after supplying the nitrogen-based gas to the reaction space in a state in which the substrate W has been introduced into the reaction space, a plasma generation step is performed with supplying the process gas but stopping the supply of the nitrogen-based gas, thereby the passivation using the remaining nitrogen-based and the hydrogen plasma annealing may be simultaneously performed in the plasma generation step.

Figure 3:
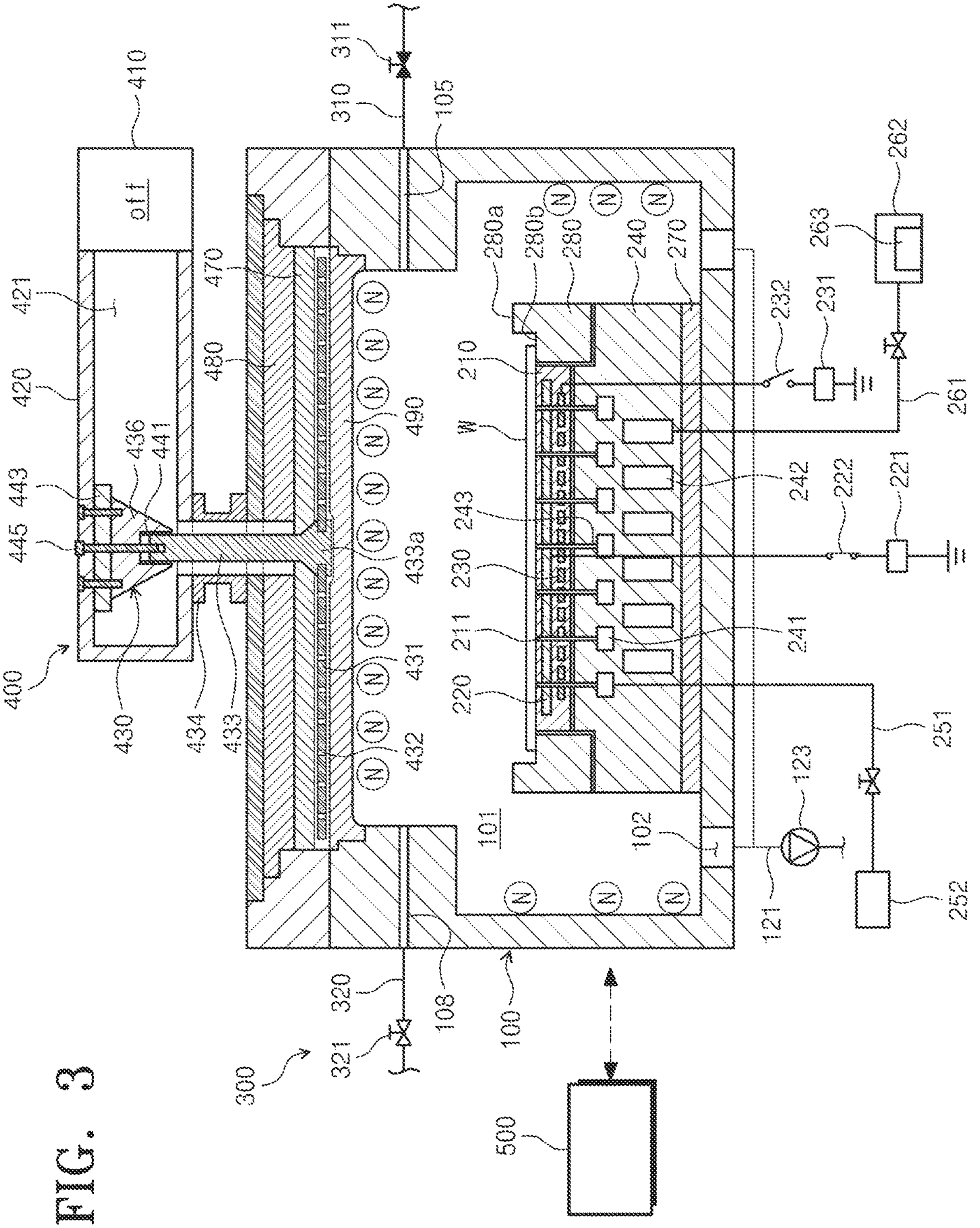
FIG. 3 is a view illustrating a state of the substrate treating apparatus performing step S20 of FIG. 2 according to an embodiment of the inventive concept.

FIG. 3 is a view illustrating a state of the substrate treating apparatus performing step S20 of FIG. 2 according to an embodiment of the inventive concept. Referring further to FIG. 3 in addition to FIG. 2, the substrate treating apparatus in a state in which step S20 is performed will be described. Referring to FIG. 3, the opening/closing member 321 of the second gas supply line 320 is opened to introduce the nitrogen-based gas into the reaction space 101. In this case, the microwave power source 410 is controlled in an off state.

Figure 4:
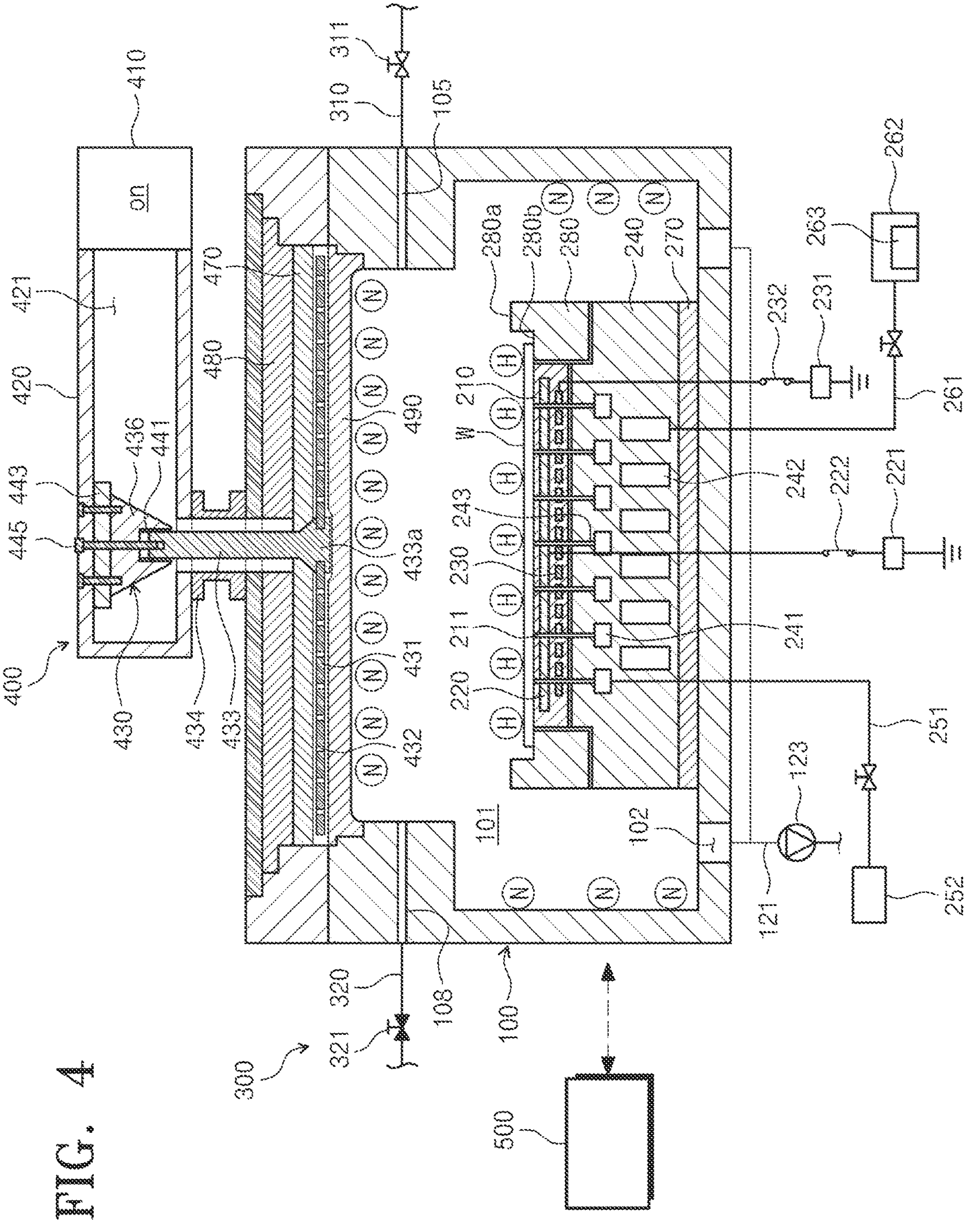
FIG. 4 is a view illustrating a state of the substrate treating apparatus performing steps S40 and S50 of FIG. 2 according to an embodiment of the inventive concept.

FIG. 4 is a view illustrating a state of a substrate treating apparatus performing steps S40 and S50 of FIG. 2 according to an embodiment of the inventive concept. Referring further to FIG. 4 in addition to FIG. 2, the substrate treating apparatus in a state in which steps S40 and S50 are performed will be described. 2. Referring to FIG. 4, the opening/closing member 311 of the first gas supply line 310 is opened to introduce the process gas into the reaction space 101. According to the introduction of the process gas, the process gas flows around the substrate W, and the nitrogen-based gas remains in an area outside a periphery of the substrate W. In this case, the microwave power source 410 is controlled to be turned on. As the microwave power source 410 is controlled to be turned on, the introduced process gas and the remaining nitrogen-based gas are excited to be in the plasma state.

Figure 5:
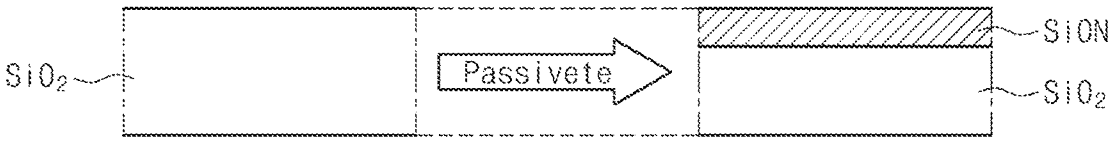
FIG. 5 is a view schematically showing surfaces of insulation components changing by a nitrogen passivation through step S50 of FIG. 2.

FIG. 5 is a view schematically showing that surfaces of insulation components change by a nitrogen passivation through step S50 of FIG. 2. Although FIG. 5 illustrates a case where a material is a quartz (SiO2), those skilled in the art will understand that the same may be applied to other insulating materials (e.g., Al2O3, AlN, and Y2O3).

Referring to FIG. 5, it may be seen that a portion of a surface of a quartz component is converted into a silicon oxynitride (SiON). That is, the SiON was not deposited as a new layer on the previous quartz surface, but the previous quartz surface was converted into the SiON with a preset thickness by the passivation. Here, nitrogen (N) may be derived from the nitrogen-based gas used for passivation, and other elements, that is, silicon (Si) and oxygen (O), may be derived from the quartz.

Figure 6:
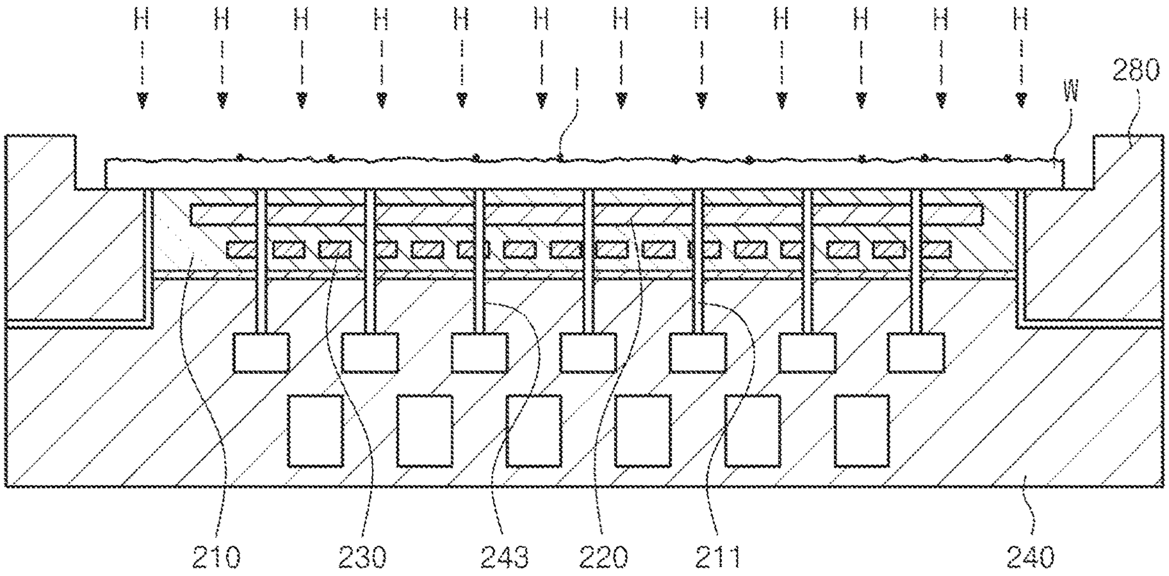
FIG. 6 is a view illustrating a state of the substrate in a first treating step in a process of performing step S50 of FIG. 2.
Figure 7:
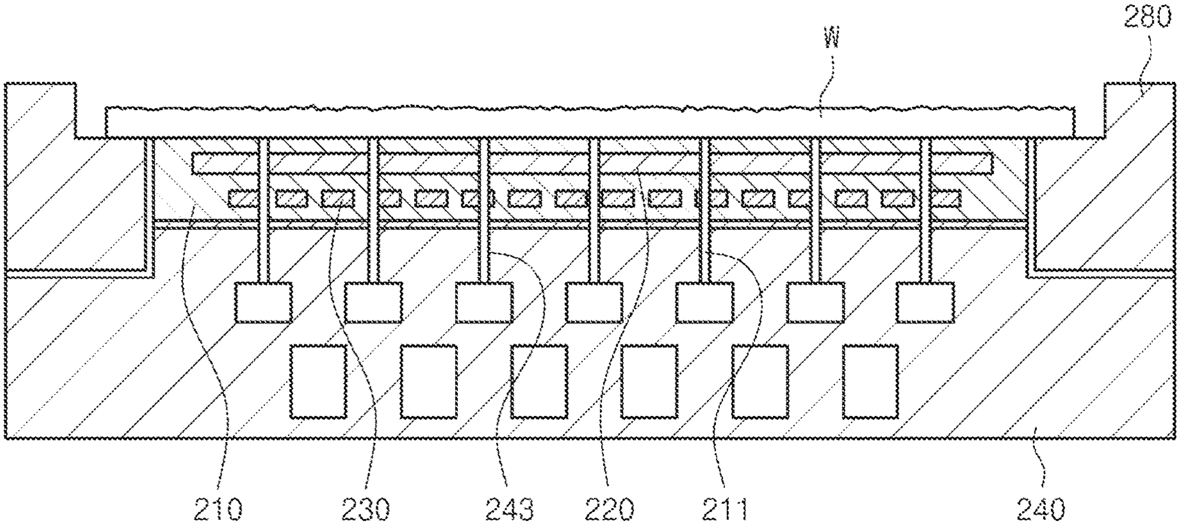
FIG. 7 is a view showing a state of the substrate after the first treating step of FIG. 6 is performed.

FIG. 6 is a view illustrating a state of the substrate in the first treating step in a process of performing step S50 of FIG. 2. FIG. 7 is a view illustrating a state of the substrate in a second treating step in the process of performing step S50 of FIG. 2. The first treating step and the second treating step are examples of steps of performing a hydrogen plasma annealing (HPA) on the substrate.

Referring to FIG. 6, the first treating step may be a step of removing impurities I remaining on the substrate W. The impurities I to be removed in the first treating step may be a etching by-product generated while etching the substrate W and a residual film remaining after the etching process (a portion of film not etched). For example, the impurities I attached to the substrate W may be a compound containing germanium Ge. For example, the impurities I may include a SiGe or a GeO.

In the first treating step, the controller 500 may control the substrate support member 200 to maintain the temperature of the substrate W at a first temperature. The first temperature may be between 50 and 300 degrees Celsius (e.g., a temperature greater than or equal to 50 degrees Celsius, and less than or equal to 300 degrees Celsius). More specifically, the first temperature may be between 160 degrees Celsius and 200 degrees Celsius. In addition, while hydrogen radicals excited from the process gas are transferred to the surface of the substrate W, the temperature of the substrate W may be maintained at a first temperature to remove impurities I remaining on the substrate W. The silicon (Si) and the germanium (Ge) react with the hydrogen radicals and become volatile species, and they may be removed from the surface of the substrate W.

When the performance of the first treating step S10 is completed, as illustrated in FIG. 7, the impurities I attached to the substrate W may be removed from the substrate W.

Figure 8:
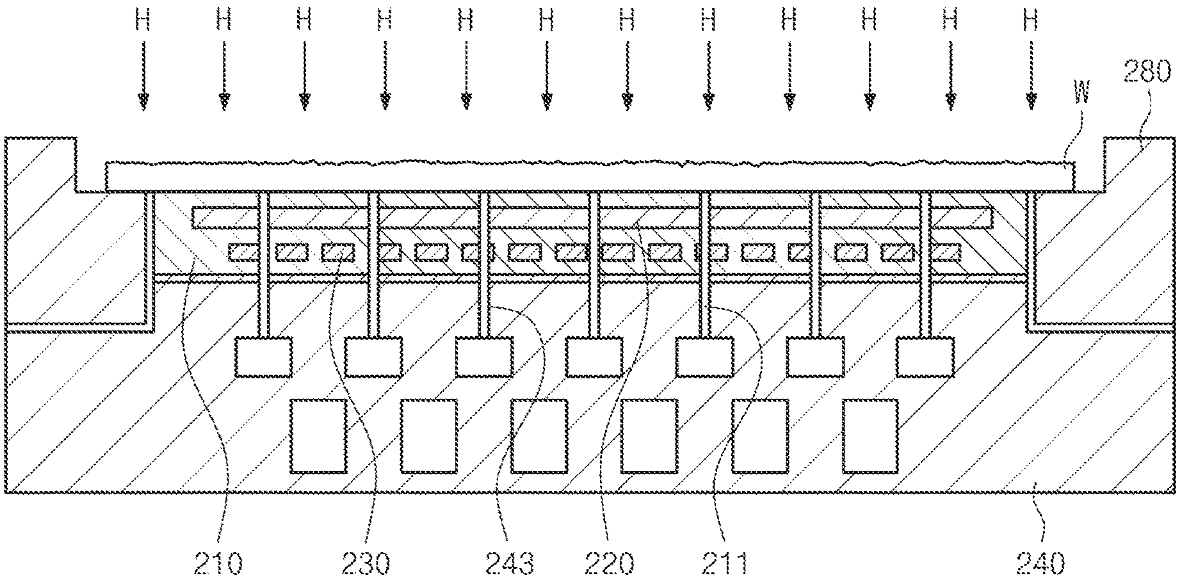
FIG. 8 is a view illustrating a state of the substrate in a second treating step in the process of performing step S50 of FIG. 2.

FIG. 8 is a view illustrating a state of the substrate in a second treating step in the process of performing step S50 of FIG. 2. Referring to FIG. 8, the second treating step may be a step of improving a surface roughness of the substrate W. As described above, the substrate W may be made of a material including a silicon (Si).

In the second treating step, the controller 500 may control the substrate support member 200 to maintain the temperature of the substrate W at a second temperature different from the first temperature described above. The second temperature may be higher than the first temperature. The second temperature may be a temperature between 400° C. and 700° C. (e.g., a temperature of 400° C. or more, and 700° C. or less). In addition, while the hydrogen radicals excited from the process gas are transferred to the surface of the substrate W, the temperature of the substrate W may be changed from the first temperature to the second temperature, and maintained at the second temperature, thereby improving the surface roughness of the substrate W.

Figure 9:
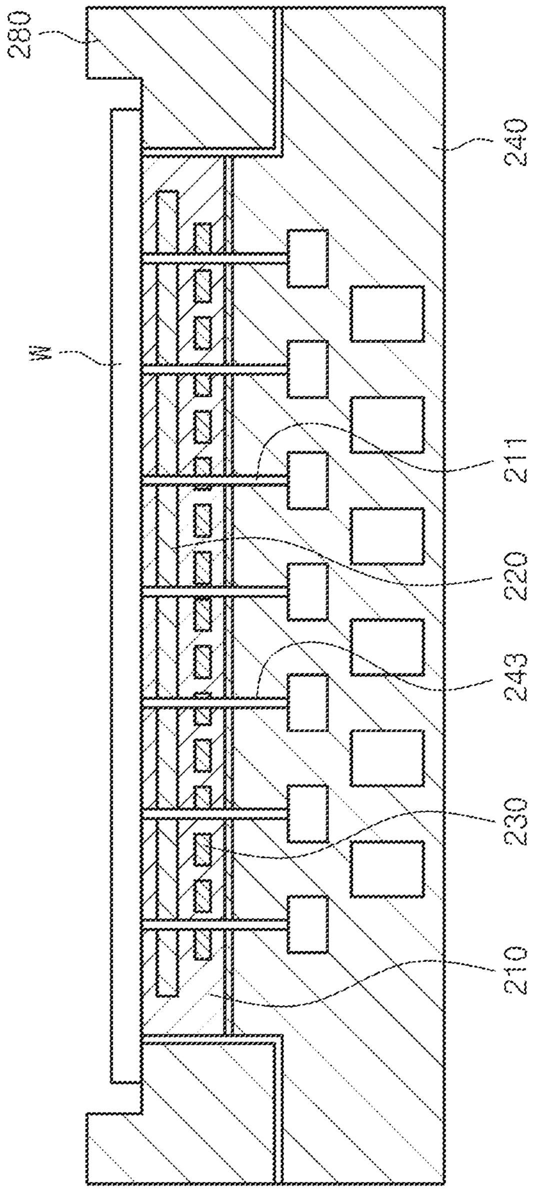
FIG. 9 is a view illustrating a state of the substrate after step S50 of FIG. 2 is performed.

When the performance of the second treating step is completed, the surface roughness on the substrate W may be improved as shown in FIG. 9.

The second treating step is performed after the first treating step is performed. Since the second treating step is performed in a state in which impurities have been removed from the substrate W, a problem of performance degradation of the semiconductor device may be minimized.

The first temperature and the second temperature can be classified in accordance with a dominant temperature range where a silicon (Si) and a germanium (Ge) become volatile species ($SiH_4$ and $GeH_4$). Once the silicon (Si) and the germanium (Ge) react with the hydrogen radicals and become volatile species, they may be removed from the surface of the substrate W.

A temperature range in which the germanium (Ge) is removed by the hydrogen radicals may be 50 degrees Celsius to 300 degrees Celsius. In an embodiment, a temperature at which the germanium (Ge) removal efficiency is highest by the hydrogen radicals is about 180 degrees. In the first treating step, it is preferable that the temperature of the substrate W does not exceed 300 degrees. This is because the silicon of substrate may be removed when the temperature exceeds 300 degrees. In the case of the silicon (Si) of the substrate W, the temperature range in which silicon is removed by the hydrogen radical is about 300° C. to 400° C., and thus when the temperature of the substrate W in the first treating step S10 exceeds 300° C., not only impurities including germanium (Ge) may be removed but also silicon may be removed, damaging the substrate W.

In the second treating step, it is preferable that the temperature of the substrate W is maintained at about 400 to 700 degrees as described above. In the case of the silicon (Si), when the temperature of the substrate W is maintained at about 400° C. to 700° C. in a hydrogen radical atmosphere, the silicon (Si) has surface diffusion thereby improving the surface roughness of the substrate W. In the second treating step, it is preferable that the temperature of the substrate W exceeds 400° C. In the case of silicon (Si) included in the substrate W, the temperature range in which silicon is removed by the hydrogen radical is about 300° C. to 400° C., and when the temperature of the substrate W drops below 400° C. in the second treating step, the surface roughness of the substrate W may not be improved, but damage to the substrate W itself may occur.

Figure 10:
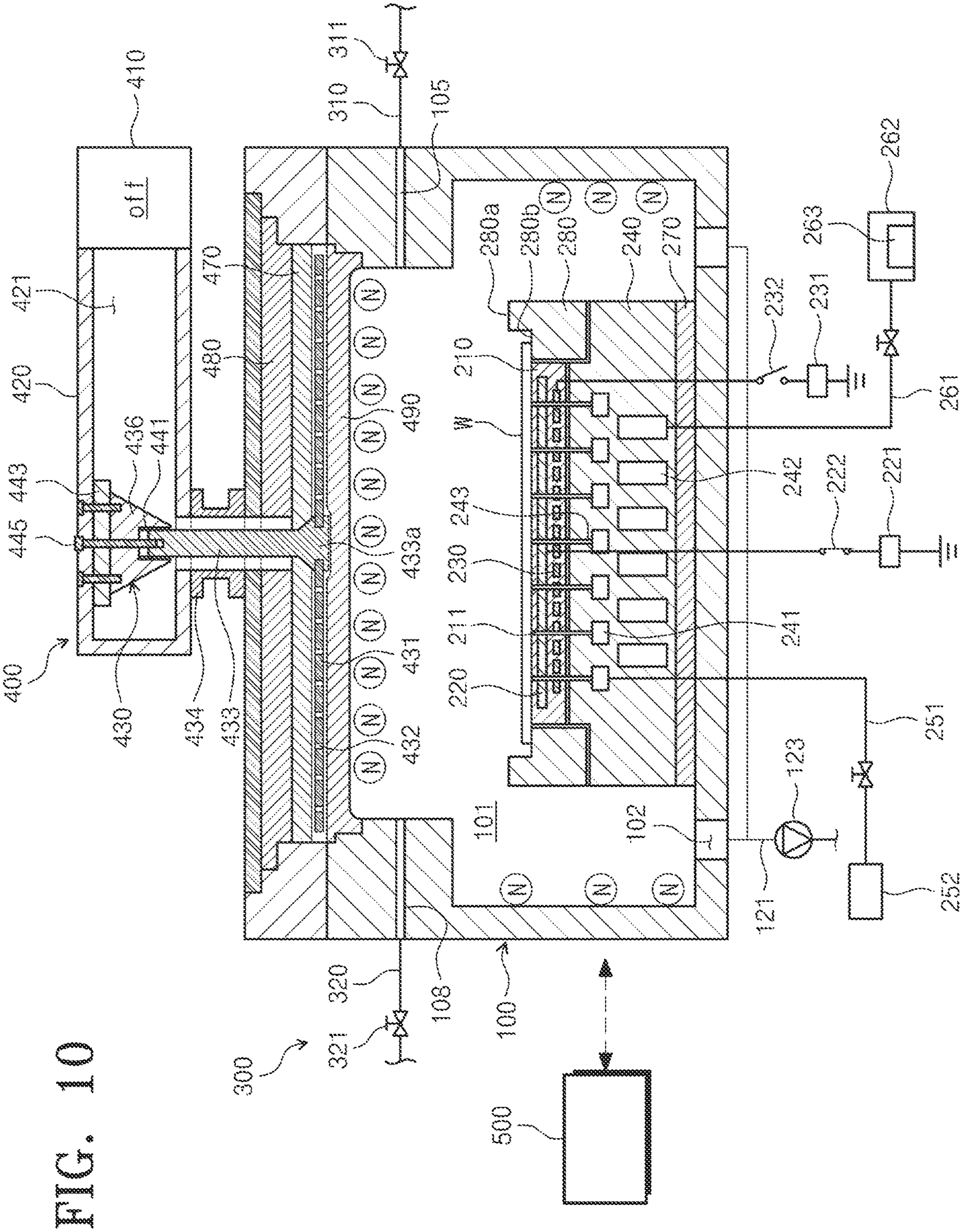
FIG. 10 is a view illustrating a state of the substrate treating apparatus simultaneously performing steps S20 and S40 of FIG. 2 according to another embodiment of the inventive concept.
Figure 11:
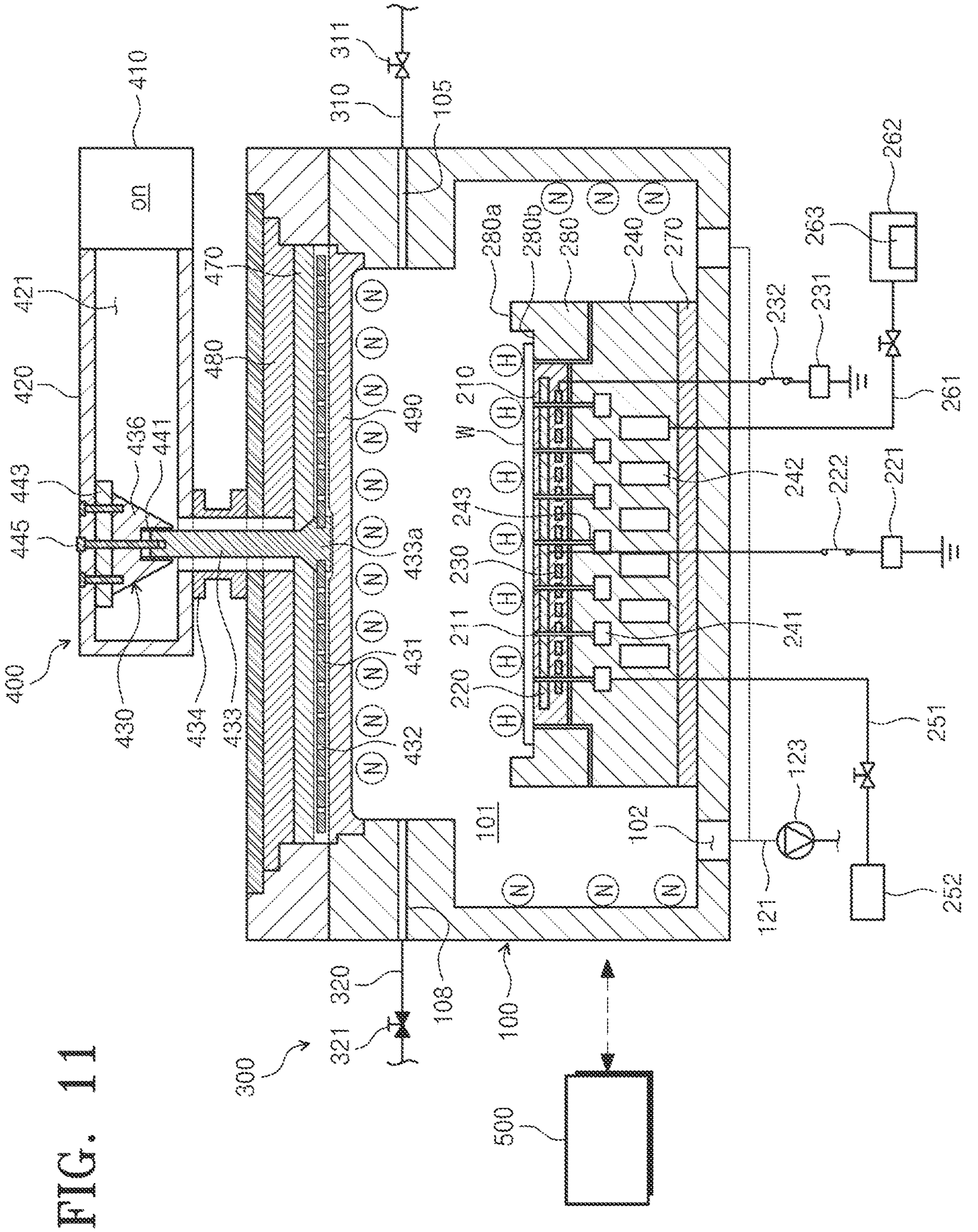
FIG. 11 is a view illustrating a state of the substrate treating apparatus performing steps S40 and S50 of FIG. 2, according to another embodiment of the inventive concept.

FIG. 10 is a view illustrating a state of the substrate treating apparatus simultaneously performing steps S20 and S40 of FIG. 2 according to another embodiment of the inventive concept. FIG. 11 is a view illustrating a state of the substrate treating apparatus performing steps S40 and S50 of FIG. 2, according to another embodiment of the inventive concept. The substrate treating method according to another embodiment of the inventive concept will be described with sequential reference to FIG. 10 and FIG. 11 in addition to FIG. 2.

Referring to FIG. 10, in the introduction of the nitrogen-based gas according to step S20 of the inventive concept, the process gas of step S40 may be supplied together. Even if steps S20 and S40 are performed together, step S30 is performed before step S50 is performed.

According to another embodiment of substrate treating method of the inventive concept, the substrate W is introduced into the reaction space 101 (step S10). After the substrate W is brought into the reaction space 101, the nitrogen-based gas is supplied to the reaction space 101 as an example of the passivation gas (step S20). The nitrogen-based gas may be supplied in a pressure atmosphere of 50 mTorr to 1 Torr at a flow rate of 10 sccm to 1000 sccm for 10 seconds to 60 seconds. While supplying the nitrogen-based gas, the process gas is supplied to the reaction space 101 (step S40). The process gas may be supplied in a pressure atmosphere of 50 mTorr to 1 Torr at a flow rate of 10 sccm to 1000 sccm for 10 seconds to 60 seconds.

Referring to FIG. 11, when the nitrogen-based gas is sufficiently supplied to the reaction space 101, the supply of the nitrogen-based gas is stopped (step S30). The process gas is introduced into the reaction space 101, and the gas in the reaction space 101 is excited into the plasma while the nitrogen-based gas remains in the reaction space 101 (step S50). In an embodiment, in the reaction space 101, the microwave power source 410 is controlled to be in an on state, and thus the process gas and the nitrogen-based gas in the reaction space 101 are excited in the plasma state.

According to steps S10 to S50, after supplying the nitrogen-based gas to the reaction space in a state in which the substrate W has been introduced into the reaction space, a plasma generation step is performed with supplying the process gas but stopping the supply of the nitrogen based gas, thereby the passivation using the remaining nitrogen based gas and the hydrogen plasma annealing may be simultaneously performed in the plasma generation step.

When the hydrogen plasma annealing on the substrate W is performed, a component having a SiON passivation layer on the surface thereof may be converted into the $SiO_2$. In other words, when the hydrogen plasma annealing (HPA) is performed on a component having a SiON passivation layer on the surface, SiON may be converted into pre-passivation state, i.e., $SiO_2$. According to an embodiment of the inventive concept, after nitrogen-based gas is supplied, the process gas is introduced, and the plasma is excited therefrom. Accordingly, the hydrogen plasma annealing process is performed while the nitrogen passivation of an insulating component using a nitrogen gas remaining in the reaction space 101. Accordingly, the entire process time is shortened, and the hydrogen plasma annealing process may be performed while a nitrogen passivation surface of the insulating component is maintained.

However, when the SiON is converted into the SiO2 through consuming most of nitrogen in SiON layer, the oxygen in the SiO2 may react with the hydrogen radicals and be separated into OH* forms. This means damage to the quartz component because it leads to an oxygen loss in SiO2. However, according to an embodiment of the inventive concept, damage to the quartz component may be prevented while shortening the entire process time by performing the passivation simultaneously with the process of the hydrogen plasma annealing. For example, according to an embodiment of the inventive concept, unit per equipment hour (UPEH) may be increased by 1.5 times compared to the prior art.

As described above, the substrate W on which the hydrogen plasma annealing treatment is completed may be carried out from the reaction space 101. The substrate W may be carried out by, for example, a means such as a robot arm.

After the substrate W is taken out, the substrate to be treated is brought into the reaction space 101, and steps S20 to S50 may be performed. Meanwhile, after performing steps S10 to S50 on one substrate according to necessity and experimental results, only step S50 may be performed on a number of n substrates to be treated next. The n pieces may be appropriately adjusted to a time point before a surface of a passivated insulation member loses an effect according to passivation.

In the above-described example, the plasma including hydrogen radicals is generated through a microwave, but the inventive concept is not limited thereto, and the above-described embodiment may be applied equally or similarly as long as it has a temperature control member for controlling the temperature of the substrate W and a plasma source for generating the plasma from the process gas.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:

a process chamber having a reaction space with one or more insulation members exposed to the reaction space;

a substrate support member supporting a substrate at the reaction space, wherein the substrate includes silicon;

a gas supply member selectively supplying a passivation gas and a process gas to the reaction space, wherein the process gas includes a hydrogen;

a plasma source exciting a gas into a plasma; and a controller, wherein the controller is configured to control the gas supply member and the plasma source to supply and excite the process gas that reacts with germanium impurities adhered to the substrate including silicon, and after a substrate to be treated is taken into the reaction space and supported by the support member, the controller is configured to control the gas supply member and the plasma source to perform:

a first step of supplying the passivation gas and the process gas to the reaction space simultaneously; and a second step of generating a plasma in the reaction space under the condition of stopping a supply of the passivation gas but supplying the process gas, wherein the process gas is introduced in a state in which the passivation gas remains in the reaction space.

2. The substrate treating apparatus of claim 1, wherein the insulation member comprises a quartz, an A1203, an A1N, a Y203 or combinations thereof.

3. The substrate treating apparatus of claim 1, wherein the passivation gas includes a nitrogen-based gas.

4. The substrate treating apparatus of claim 1, wherein the plasma excited from the passivation gas includes nitrogen radicals.

5. The substrate treating apparatus of claim 1, wherein the plasma excited from the process gas includes hydrogen radicals.

6. The substrate treating apparatus of claim 1, wherein at least one exhaust hole are formed at the process chamber and connected to an exhaust line exhausting the reaction space, and the controller is configured to control a decompression member connected to the exhaust line so that a pressure of the reaction space reaches 50 mTorr to 1 Torr, and the passivation gas is controlled to be supplied at 10 sccm to 1000 sccm for 10 seconds to 60 seconds.

7. The substrate treating apparatus of claim 6, wherein the controller is configured to control the gas supply member so as to supply the process gas at 10 sccm to 1000 sccm and supply the passivation gas.

8. The substrate treating apparatus of claim 1, wherein the controller is configured to control the substrate support member so that a temperature of the substrate is adjusted to a first temperature during the second step, and then the temperature of the substrate is adjusted to a second temperature which is different from the first temperature.

9. The substrate treating apparatus of claim 1, wherein the pressure of the reaction space reaches a value of greater than 300 mTorr and less than or equal to 1 Torr.

10. The substrate treating apparatus of claim 1, wherein the controller is configured to control the substrate support member so that a temperature of the substrate is between 50 degrees Celsius and 300 degrees Celsius during the second step.

11. The substrate treating apparatus of claim 1, wherein the process chamber is a vacuum chamber.

12. The substrate treating apparatus of claim 1, wherein at least one exhaust hole is formed at the process chamber and connected to an exhaust line exhausting the reaction space, and the controller is configured to control a decompression member connected to the exhaust line so that a pressure of the reaction space reaches a value of greater than 150 mTorr and less than or equal to 1 Torr.

13. A substrate treating apparatus comprising:

a process chamber having a reaction space with at least one insulation member being exposed to the reaction space, the at least one insulation member comprising a quartz, an A1203, an A1N, a Y203, or combinations thereof;

a substrate support member supporting a substrate at the reaction space, wherein the substrate includes silicon;

a gas supply member selectively supplying a passivation gas including a nitrogen-based gas and a process gas including a hydrogen to the reaction space;

a plasma source exciting the gas to a plasma; and a controller, wherein the controller is configured to control the gas supply member and the plasma source to supply the process gas with germanium impurities adhered to the substrate including silicon, and the controller, after a substrate to be treated is taken into the reaction space and supported by the support member, is configured to control the gas supply member and the plasma source to perform:

a first step of supplying the passivation gas and the process gas to the reaction space simultaneously; and a second step of generating a plasma in the reaction space under the condition of stopping a supply of the passivation gas but supplying the process gas, wherein the process gas is introduced in a state in which the passivation gas remains in the reaction space.

14. The substrate treating apparatus of claim 13, wherein at least one exhaust hole is formed at the process chamber and connected to an exhaust line exhausting the reaction space, and the controller is configured to control a decompression member connected to the exhaust line so that a pressure of the reaction space reaches a value of greater than 300 mTorr and less than or equal to 1 Torr.

15. The substrate treating apparatus of claim 13, wherein the process chamber is a vacuum chamber.

16. The substrate treating apparatus of claim 13, wherein the controller is configured to control the substrate support member so that a temperature of the substrate is between 50 degrees Celsius and 300 degrees Celsius during the second step.

* * * * *